United States Patent
Noh et al.

(10) Patent No.: US 11,955,085 B2
(45) Date of Patent: Apr. 9, 2024

(54) INVERTER CIRCUIT, GATE DRIVER USING THE SAME, AND DISPLAY DEVICE

(71) Applicant: LG Display Co., Ltd., Seoul (KR)

(72) Inventors: Seok Noh, Paju-si (KR); Ki Min Son, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/859,947

(22) Filed: Jul. 7, 2022

(65) Prior Publication Data

US 2023/0008896 A1 Jan. 12, 2023

(30) Foreign Application Priority Data

Jul. 8, 2021 (KR) .......................... 10-2021-0089981

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0842* (2013.01); *G09G 2310/0297* (2013.01); *G09G 2310/08* (2013.01); *G09G 2320/0247* (2013.01); *G09G 2320/043* (2013.01); *G09G 2320/0673* (2013.01); *G09G 2330/021* (2013.01)

(58) Field of Classification Search
None
See application file for complete search history.

(56) References Cited

U.S. PATENT DOCUMENTS

| 2009/0040203 | A1 | 2/2009 | Kim et al. | |
| 2015/0317954 | A1* | 11/2015 | Jang | G09G 3/3677 345/82 |
| 2016/0322116 | A1* | 11/2016 | Jang | G11C 19/28 |
| 2019/0066596 | A1* | 2/2019 | Xue | G11C 19/28 |
| 2019/0164498 | A1* | 5/2019 | Jang | G09G 3/32 |
| 2020/0372851 | A1* | 11/2020 | Kim | G09G 3/2092 |

FOREIGN PATENT DOCUMENTS

| CN | 109285505 | B | * | 6/2020 | ........... G09G 3/3266 |
| KR | 20160073928 | A | * | 6/2016 | ........... G09G 3/3266 |
| KR | 10-2018-0028591 | A | | 3/2018 | |
| KR | 10-2018-0066934 | A | | 6/2018 | |
| KR | 10-2019-0007727 | A | | 1/2019 | |
| KR | 20200048632 | A | * | 5/2020 | ........... G09G 3/3614 |
| KR | 20210075851 | A | * | 6/2021 | ........... G09G 3/3225 |

* cited by examiner

*Primary Examiner* — Benjamin X Casarez
(74) *Attorney, Agent, or Firm* — Birch, Stewart, Kolasch & Birch, LLP

(57) ABSTRACT

An inverter circuit, a gate driver using the same, and a display device according to an embodiment are discussed. The inverter circuit can include a first transistor connected between a high potential voltage line and a first node; a second transistor having a gate connected to the first node and turned on according to a voltage of the first node to charge a second control node to a high potential voltage of the high potential voltage line; a third transistor having a gate connected to a first control node, a first electrode connected to the first node, and a second electrode connected to the second control node; and a fourth transistor having a gate connected to the first control node, a first electrode connected to the second control node, and a second electrode connected to a low potential voltage line.

23 Claims, 18 Drawing Sheets

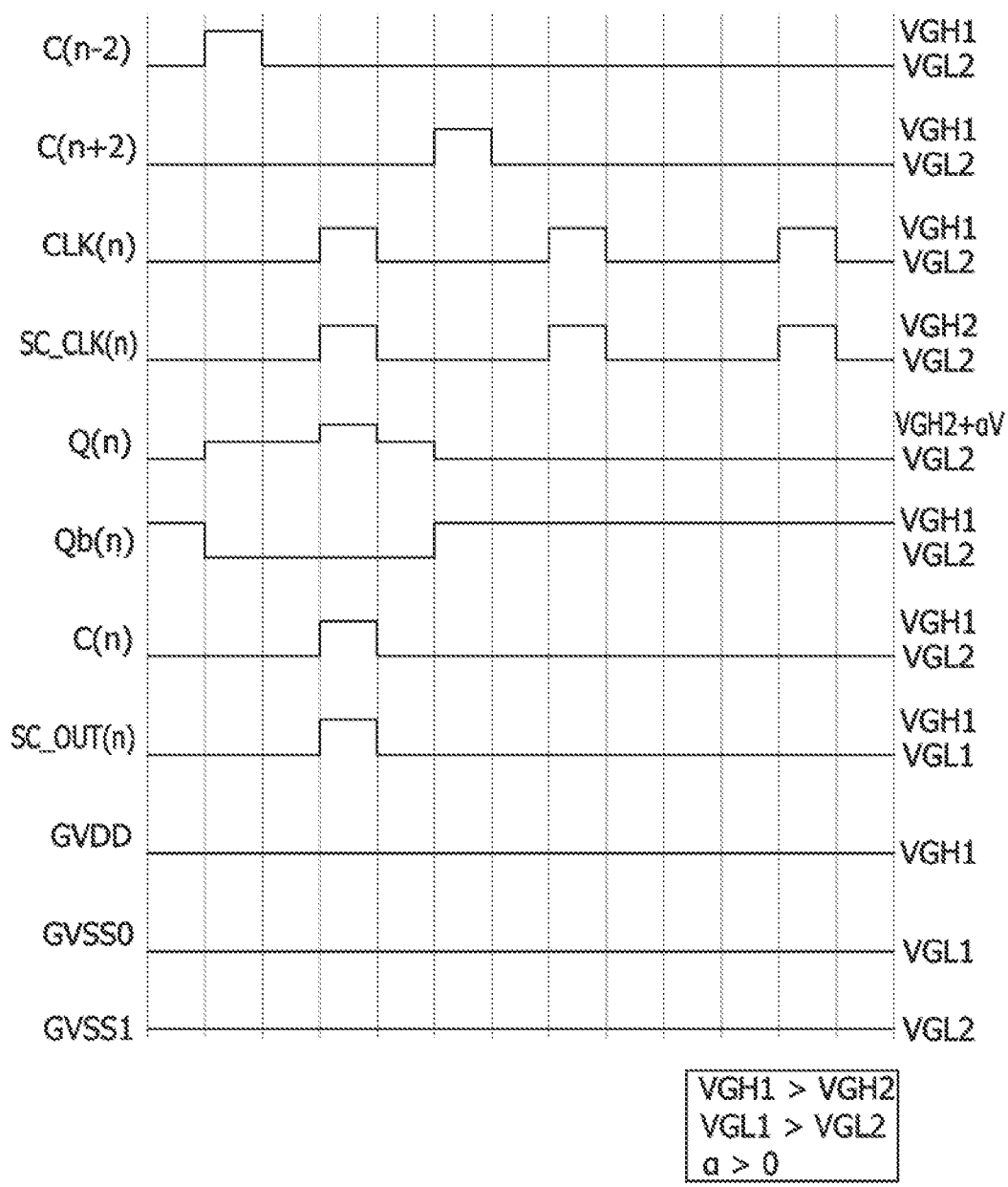

| CLASSIFICATION | SCAN Driver | |
|---|---|---|
| | COMPARATIVE INVERTER | NEW INVERTER |
| GVSS1 Current [mA] | 1.186 | 19.626 |
| GVSS2 Current [mA] | 18.241 | - |
| Total [mA] | 19.427 | 19.626 |

| CLASSIFICATION | EM Driver | |
| --- | --- | --- |
| | COMPARATIVE INVERTER | NEW INVERTER |
| GVSS1 Current [mA] | 0.054 | 10.509 |
| GVSS2 Current [mA] | 19.407 | - |
| Total [mA] | 19.461 | 10.509 |

INVERTER CIRCUIT, GATE DRIVER USING THE SAME, AND DISPLAY DEVICE

CROSS-REFERENCE TO RELATED APPLICATION

This application claims priority to and the benefit under 35 U.S.C. § 119(a) to Korean Patent Application No. 10-2021-0089981, filed on Jul. 8, 2021, the entire contents of which are hereby expressly incorporated by reference into the present application.

BACKGROUND

1. Field of the Invention

The present disclosure relates to an inverter circuit, a gate driver using the same, and a display device.

2. Discussion of Related Art

Display devices includes a liquid crystal display (LCD) device, an electroluminescence display device, a field emission display (FED) device, a plasma display panel (PDP), and the like.

Electroluminescent display devices are divided into inorganic light emitting display devices and organic light emitting display devices according to a material of a light emitting layer. An active-matrix type organic light emitting display device reproduces an input image using a self-emissive element which emits light by itself, for example, an organic light emitting diode (OLED). An organic light emitting display device has advantages in that a response speed is fast and luminous efficiency, luminance, and a viewing angle are large.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when a driving signal such as a scan signal, an EM signal, and a data signal is supplied to a plurality of sub-pixels formed in the display panel, the selected sub-pixel transmits light or emits light directly to thereby display an image.

In this case, the gate driver controls the charging and discharging of a Q node and a Qb node to supply the scan signal or the gate signal to the display panel. However, leakage current as well as malfunction can occur due to the ripple of the Q node.

SUMMARY OF THE INVENTION

The present disclosure is directed to address all the above-described necessity and limitations.

The present disclosure is directed to providing an inverter circuit, a gate driver using the same, and a display device.

It should be noted that objects of the present disclosure are not limited to the above-described objects, and other objects of the present disclosure will be apparent to those skilled in the art from the following descriptions.

An inverter circuit of the present disclosure includes a first transistor connected between a high potential voltage line and a first node; a second transistor having a gate connected to the first node and turned on according to a voltage of the first node to charge a second control node to a high potential voltage applied to the high potential voltage line; a third transistor having a gate connected to a first control node, a first electrode connected to the first node, and a second electrode connected to the second control node; and a fourth transistor having a gate connected to the first control node, a first electrode connected to the second control node, and a second electrode connected to a low potential voltage line, wherein the third transistor and the fourth transistor are turned on according to a voltage of the first control node to discharge the second control node to a low potential voltage applied to the low potential voltage line.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 7 is a waveform diagram illustrating input and output signals and voltages of control nodes of the scan driver shown in FIG. 6;

DETAILED DESCRIPTION OF THE EMBODIMENTS

Figure 1:
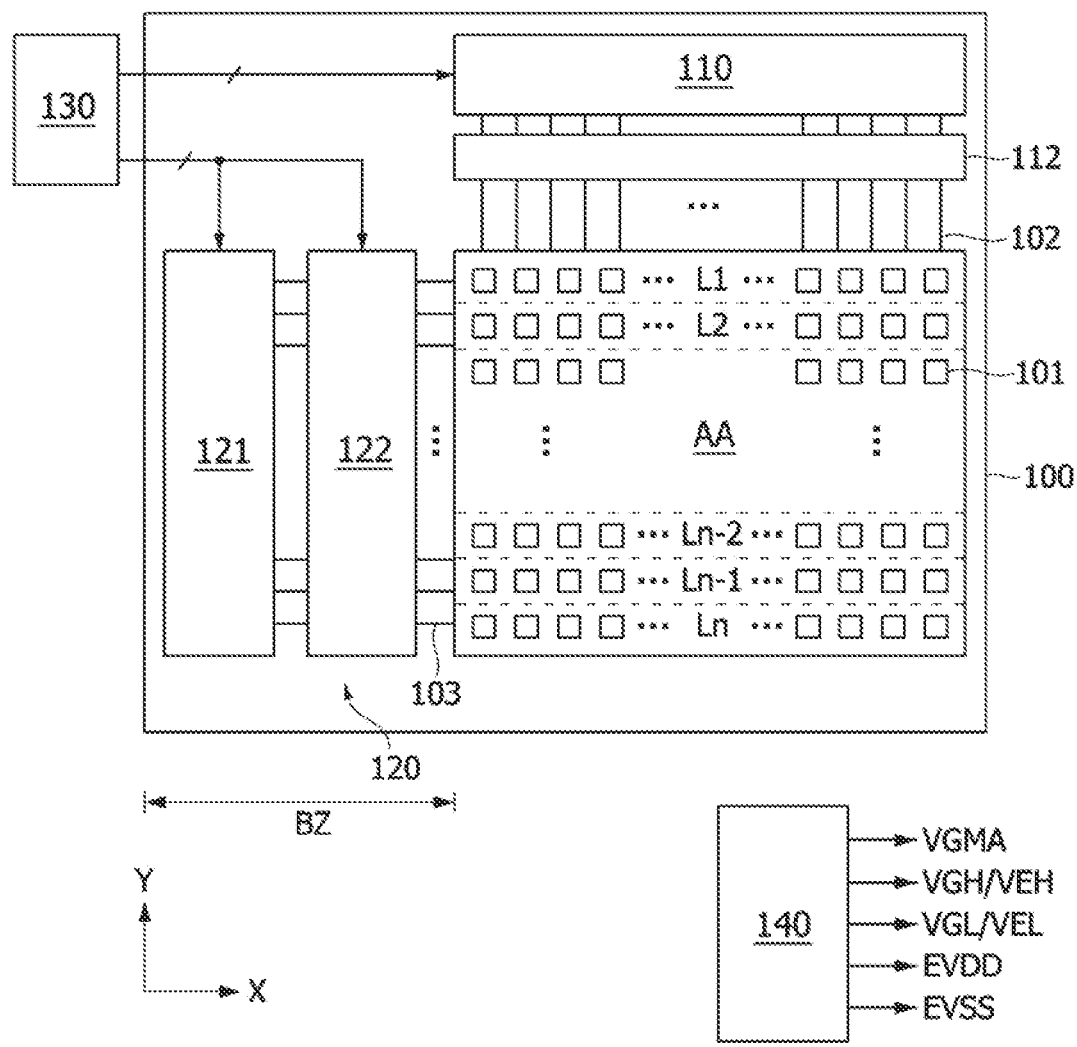
FIG. 1 is a block diagram illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies can be omitted to avoid unnecessarily obscuring the subject matter of the present disclosure.

The terms such as "comprising," "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "below," and "next," one or more components can be positioned between the two components unless the terms are used with the term "immediately" or "directly."

The terms "first," "second," and the like can be used to distinguish components from each other, but the functions or structures of the components are not limited by ordinal numbers or component names in front of the components.

The same reference numerals can refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings. All the components of each display device according to all embodiments of the present disclosure are operatively coupled and configured.

FIG. 1 is a block diagram illustrating a display device according to an embodiment of the present disclosure.

Referring to FIG. 1, the display device according to an embodiment of the present disclosure includes a display panel 100, a display panel driver for writing pixel data to pixels of the display panel 100, and a power supply 140 for generating power necessary for driving the pixels and the display panel driver.

The display panel 100 includes a pixel array AA that displays an input image. The pixel array AA includes a plurality of data lines 102, a plurality of gate lines 103 intersected with the data lines 102, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines 103. Sub-pixels arranged in a column direction Y along a data line direction share the same data line 102. One horizontal period 1H is a time obtained by dividing one frame period by the total number of pixel lines L1 to Ln.

Touch sensors can be disposed on the display panel 100. A touch input can be sensed using separate touch sensors or can be sensed through pixels. The touch sensors can be disposed as an on-cell type or an add-on type on the screen of the display panel or implemented as in-cell type touch sensors embedded in the pixel array AA.

The display panel 100 can be implemented as a flexible display panel. The flexible display panel can be made of a plastic OLED panel. An organic thin film can be disposed on a back plate of the plastic OLED panel, and the pixel array AA can be formed on the organic thin film.

The back plate of the plastic OLED panel can be a polyethylene terephthalate (PET) substrate. The organic thin film is formed on the back plate. The pixel array AA and a touch sensor array can be formed on the organic thin film. The back plate blocks moisture permeation so that the pixel array AA is not exposed to humidity. The organic thin film can be a thin Polyimide (PI) film substrate. A multi-layered buffer film can be formed of an insulating material on the organic thin film. Lines can be formed on the organic thin film so as to supply power or signals applied to the pixel array AA and the touch sensor array.

To implement color, each of the pixels can be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels can further include a white sub-pixel. Each of the sub-pixels 101 includes a pixel circuit. The pixel circuit is connected to the data line 102 and the gate line 103.

Hereinafter, a pixel can be interpreted as having the same meaning as a sub-pixel.

The power supply 140 generates DC power required for driving the pixel array AA and the display panel driving circuit of the display panel 100 by using a DC-DC converter. The DC-DC converter can include a charge pump, a regulator, a buck converter, a boost converter, and the like. The power supply 140 can adjust a DC input voltage from a host system and thereby generate DC voltages such as a gamma reference voltage VGMA, gate-on voltages VGH and VEH, gate-off voltages VGL and VEL, a pixel driving voltage EVDD, and a pixel low-potential power supply voltage EVSS. The gamma reference voltage VGMA is supplied to a data driver 110. The gate-on voltages VGH and VEH and the gate-off voltages VGL and VEL are supplied to a gate driver 120. The pixel driving voltage EVDD and the pixel low-potential power supply voltage EVSS are commonly supplied to the pixels.

The display panel driving circuit writes pixel data (digital data) of an input image to the pixels of the display panel 100 under the control of a timing controller (TCON) 130.

The display panel driving circuit includes the data driver 110 and the gate driver 120.

A de-multiplexer (DEMUX) 112 can be disposed between the data driver 110 and the data lines 102. The de-multiplexer 112 sequentially connects one channel of the data driver 110 to the plurality of data lines 102 and distributes in a time division manner the data voltage outputted from one channel of the data driver 110 to the data lines 102, thereby reducing the number of channels of the data driver 110. The de-multiplexer 112 can be omitted. In this case, output buffers AMP of the data driver 110 are directly connected to the data lines 102.

The display panel driving circuit can further include a touch sensor driver for driving the touch sensors. The touch sensor driver is omitted from FIG. 1. In a mobile device, the timing controller 130, the power supply 140, the data driver 110, and the like can be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

In the data driver 110, the output buffer AMP included in one channel can be connected to adjacent data lines 102 through the de-multiplexer 112. The de-multiplexer 112 can be formed directly on the substrate of the display panel 100 or integrated into one drive IC together with the data driver 110.

The gate driver 120 can be implemented as a gate in panel (GIP) circuit formed directly on a bezel BZ area of the display panel 100 together with the TFT array of the pixel array AA. The gate driver 120 sequentially outputs gate signals to the gate lines 103 under the control of the timing controller 130. The gate driver 120 can sequentially supply the gate signals to the gate lines 103 by shifting the gate signals using a shift register.

The gate signal can include a scan signal for selecting pixels of a line in which data is to be written in synchronization with the data voltage, and an EM signal defining an emission time of pixels charged with the data voltage.

The gate driver 120 can include a scan driver 121, and an EM driver 122.

The scan driver 121 outputs a scan signal SCAN in response to a start pulse and a shift clock from the timing controller 130, and shifts the scan signal SCAN according to the shift clock timing. The EM driver 122 outputs an EM signal EM in response to a start pulse and a shift clock from the timing controller 130, and sequentially shifts the EM signal EM according to the shift clock. Therefore, the scan signal SCAN, and the EM signal EM are sequentially supplied to the gate lines 103 of the pixel lines L1 to Ln. In case of a bezel-free model, at least some of transistors constituting the gate driver 120 and clock wirings can be dispersedly disposed in the pixel array AA.

The timing controller 130 receives, from a host system, digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync can be omitted. The data enable signal DE has a cycle of one horizontal period (1H).

The host system can be any one of a television (TV) system, a set-top box, a navigation system, a personal computer (PC), a home theater system, a vehicle system, and a mobile device system.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (Phase-Alternating Line) scheme.

A display panel driving circuit can operate in a low-speed driving mode. The low-speed driving mode can be set to reduce power consumption of a display device when there is no change in an input image for a preset number of frames in analysis of the input image. In the low-speed driving mode, the power consumption of the display panel driving circuit and a display panel 100 can be reduced by lowering a refresh rate of pixels when a still image is input for a predetermined time or longer. A timing controller 130 can lower a frame frequency to a frequency between 1 Hz and 30 Hz to lower the refresh rate of the pixels in the low-speed driving mode. A flicker can be seen in a displayed image at a frame frequency of 60 Hz or less.

In order to alleviate the flicker in the low-speed driving mode, the timing controller 130 can maintain a high frequency of an EM signal EM when the frame frequency is lowered in the low-speed driving mode, and can lower frequencies of a scan signal SCAN and a data voltage Vdata. In this case, when entering the low-speed driving mode, output frequencies of a scan driver 121 and a data driver 110 are lowered under control of the timing controller 130, but an output frequency of an EM driver 122 is maintained.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer 112, and a gate timing control signal for controlling the operation timing of the gate driver 120.

The voltage level of the gate timing control signal outputted from the timing controller 130 can be converted into the gate-on voltages VGH and VEH and the gate-off voltages VGL and VEL through a level shifter and then supplied to the gate driver 120. For example, the level shifter converts a low level voltage of the gate timing control signal into the gate-off voltages VGL and VEL and converts a high level voltage of the gate timing control signal into the gate-on voltages VGH and VEH. The gate timing signal includes the start pulse and the shift clock.

Figure 2:
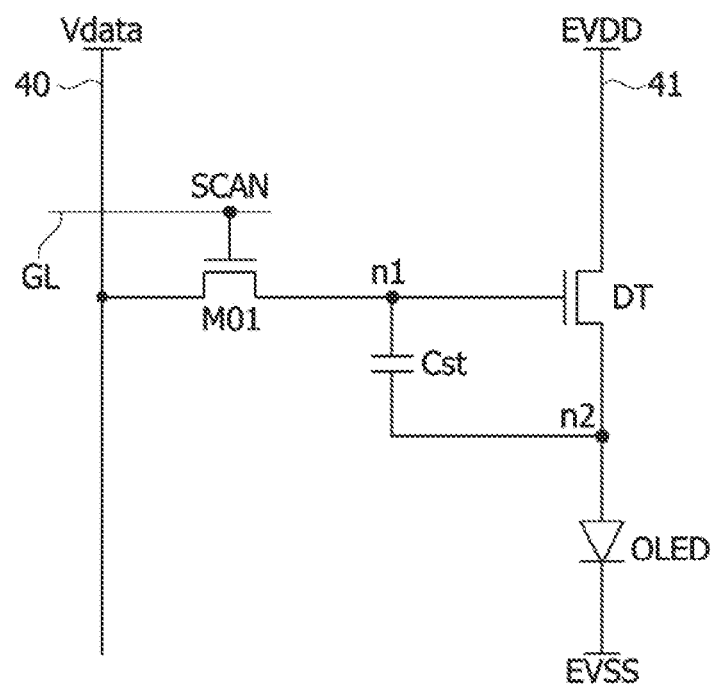
FIGS. 2 to 4 are circuit diagrams illustrating various pixel circuits applicable to a pixel circuit of the present disclosure.
Figure 3:
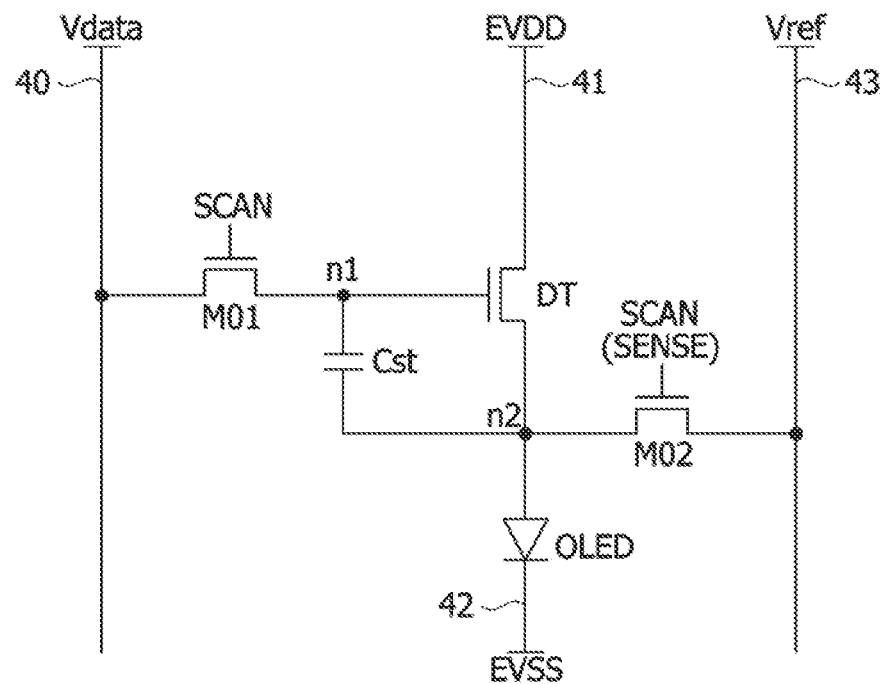
Figure 4:
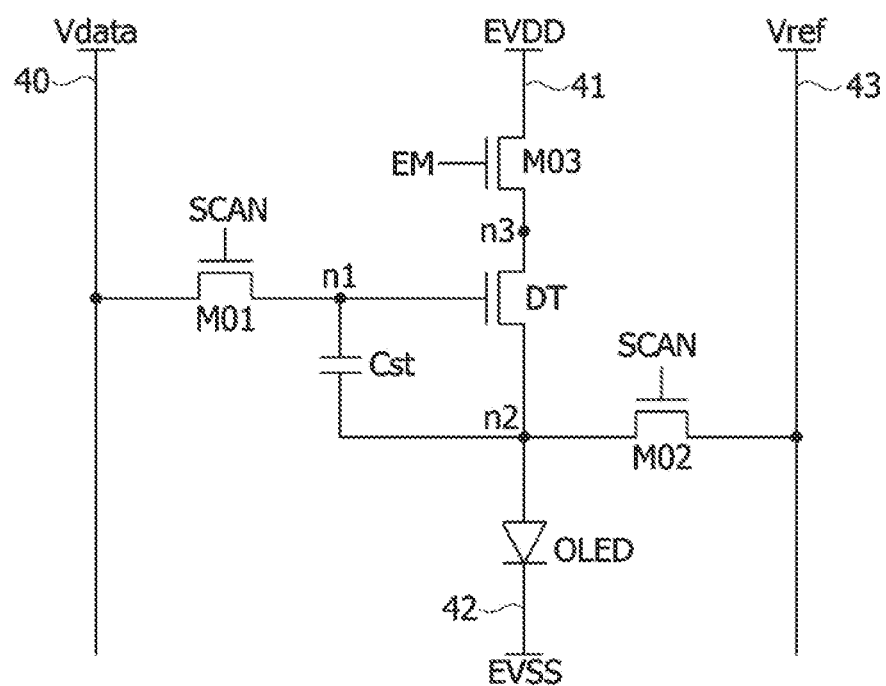

FIGS. 2 to 4 are circuit diagrams illustrating various pixel circuits applicable to a pixel circuit of the present disclosure.

Referring to FIG. 2, the pixel circuit includes a light emitting element OLED, a driving element DT which supplies a current to the light emitting element OLED, a switch element M01 which connects a data line 40 and a gate (or gate electrode) of the driving element DT in response to a scan signal SCAN, and a capacitor Cst connected to a gate (or gate electrode) of the driving element DT. The driving element DT and the switch element M01 can be implemented with n-channel transistors. But the present disclosure is not limited thereto. The driving element DT and the switch element M01 can also be implemented with p-channel transistors.

An organic light emitting diode used as the light emitting element can have a tandem structure in which a plurality of light emitting layers are stacked. The organic light emitting diode having the tandem structure can improve the luminance and lifespan of the pixel.

A pixel driving voltage EVDD is applied to a first electrode of the driving element DT through a first power line 41. The driving element DT drives the light emitting element OLED by supplying a current to the light emitting element OLED according to a gate-source voltage Vgs. The light emitting element OLED is turned on and emits light when a forward voltage between an anode and a cathode is greater than or equal to a threshold voltage.

A storage capacitor Cst is connected between a first node n1 and a second node n2. The storage capacitor Cst charges the gate-source voltage Vgs of the driving element DT.

FIG. 3 illustrates an example of a pixel circuit connected to an external compensation circuit.

Referring to FIG. 3, the pixel circuit further includes a second switch element M02 connected between a reference voltage line 43 and a second electrode (or source) of the driving element DT. In this pixel circuit, the driving element DT and the switch elements M01 and M02 can be implemented with n-channel transistors. But the present disclosure is not limited thereto. The driving element DT and the switch elements M01 and M02 can also be implemented with p-channel transistors.

The second switch element M02 applies a reference voltage Vref in response to the scan signal SCAN or a separate sensing pulse SENSE. The reference voltage Vref is applied to the pixel circuit through the reference voltage line 43.

In a sensing mode, a current flowing through a channel of the driving element DT or a voltage between the driving element DT and the light emitting element OLED is sensed through the reference voltage line 43. The current flowing through the reference voltage line 43 is converted to a voltage through an integrator and is converted to digital data through an analog-to-digital converter (ADC). This digital data is sensing data including a threshold voltage or mobility information of the driving element DT. The sensing data is transmitted to a data operation unit. The data operation unit can receive the sensing data from the ADC to compensate for driving deviation and deterioration of the pixels by adding or multiplying a compensation value selected based on the sensing data to the pixel data.

Referring to FIG. 4, the pixel circuit includes the light emitting element OLED, the driving element DT which drives the light emitting element OLED, a plurality of switch elements M01, M02, and M03 which switch a current path connected to the driving element DT, and the capacitor Cst which stores the gate-source voltage Vgs of the driving element DT. The driving element DT and the switch elements M01, M02, and M03 can be implemented with n-channel transistors. But the present disclosure is not limited thereto. The driving element DT and the switch elements M01, M02, and M03 can also be implemented with p-channel transistors.

The light emitting element OLED emits light by a current applied through the channel of the driving element DT according to the gate-source voltage Vgs of the driving element DT which changes according to the data voltage Vdata. The light emitting element OLED can be implemented with an organic light emitting diode (OLED) including an organic compound layer formed between an anode and a cathode. The organic compound layer can include a hole injection layer HIL, a hole transport layer HTL, a light emitting layer EML, an electron transport layer ETL, an electron injection layer EIL, and the like but is not limited thereto. The anode of the light emitting element OLED is connected to the driving element DT through the second node n2, and the cathode of the light emitting element OLED is connected to a second power line 42 to which a low potential power voltage EVSS is applied.

The first switch element M01 is turned on according to a gate-on voltage VGH of the scan signal SCAN to supply the data voltage Vdata to the driving element DT connected to the first node n1 by connecting the data line to the first node n1. The first node n1 is connected to a gate of the driving element DT. Accordingly, a gate voltage of the driving element DT is the same as a voltage of the first node n1. The first switch element M01 includes a gate connected to a first gate line to which the scan signal SCAN is applied, a first electrode connected to the data line, and a second electrode connected to the first node n1.

The second switch element M02 is turned on according to the gate-on voltage VGH of the scan signal SCAN to supply the reference voltage Vref to the second node n2. The second switch element M02 has a gate connected to the first gate line to which the scan signal SCAN is applied, a first electrode connected to the reference voltage line 43 to which the reference voltage Vref is applied, and a second electrode connected to the second node n2.

The third switch element M03 is turned on according to a gate-on voltage VEH of the EM signal EM to supply the pixel driving voltage EVDD to a third node n3. The third switch element M03 includes a gate connected to a second gate line to which the EM signal EM is applied, a first electrode connected to the first power line 41 to which the pixel driving voltage EVDD is supplied, and a second electrode connected to the third node n3.

The driving element DT drives the light emitting element OLED by supplying a current to the light emitting element OLED according to the gate-source voltage Vgs. The driving element DT includes a gate connected to the first node n1, a first electrode (or drain) connected to the third node n3, and a second electrode (or source) connected to the anode of the light emitting element OLED through the second node n2.

The storage capacitor Cst is connected between the first node n1 and the second node n2. The storage capacitor Cst charges the gate-source voltage Vgs of the driving element DT.

Figure 5:
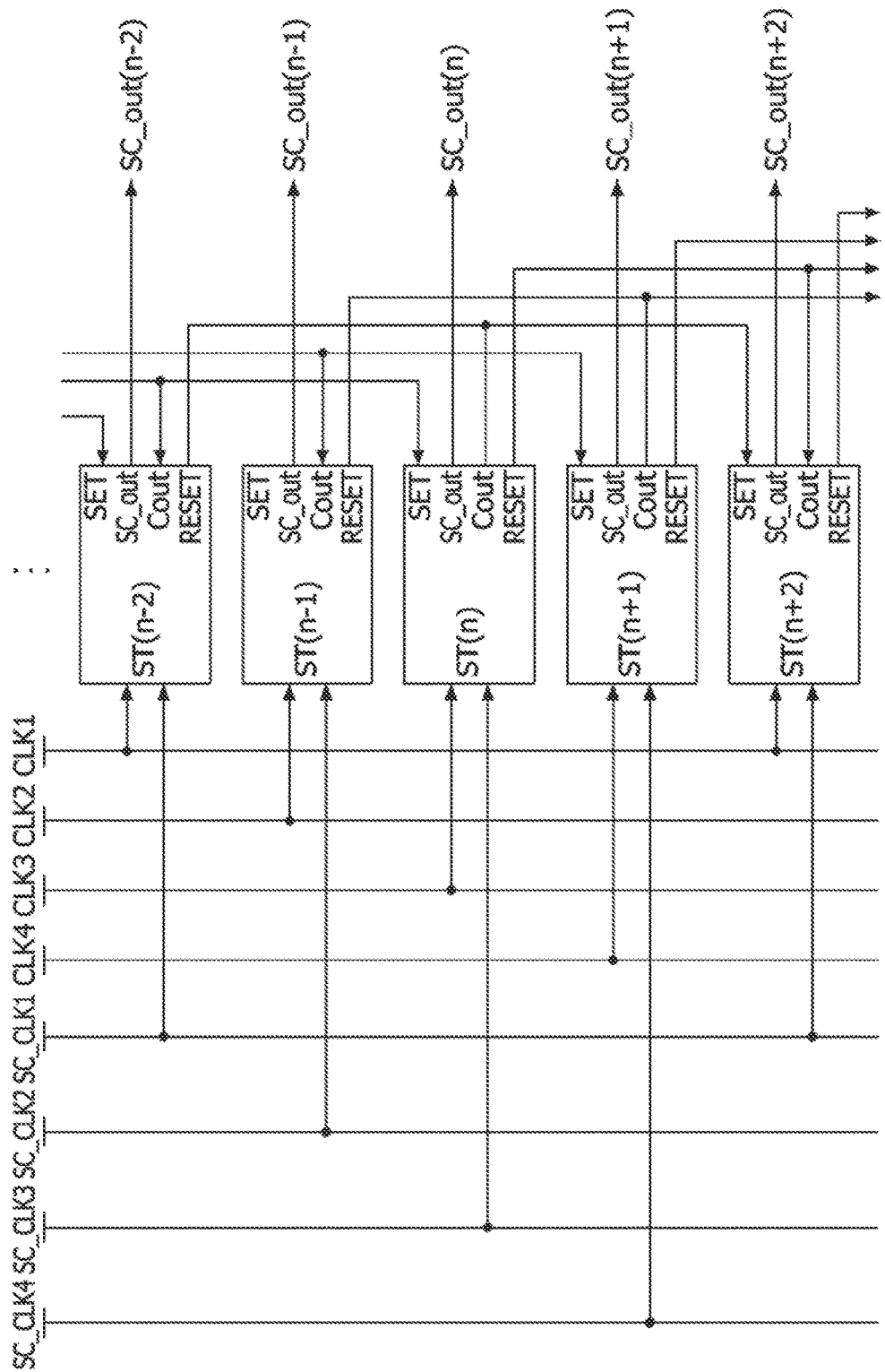
FIG. 5 is a view schematically illustrating a scan driver according to the embodiment of the present disclosure.

FIG. 5 is a view schematically illustrating a scan driver according to the embodiment of the present disclosure.

Referring to FIG. 5, the scan driver 121 according to the embodiment includes a plurality of signal transmission units ( . . . , ST(n−2), ST(n−1), ST(n), ST(n+1), ST(n+2), . . . ) passing through a carry line through which a carry signal is transmitted and cascade-connected for odd-numbered signal transmission units and even-numbered signal transmission units.

The timing controller 130 can adjust a width and multi-output of an output signal of the scan driver using a start pulse Vst input to the scan driver 121.

Each of the signal transmission units ( . . . , ST(n−2), ST(n−1), ST(n), ST(n+1), ST(n+2), . . . ) receives a start pulse or a carry signal output from a previous odd-numbered or even-numbered signal transmission unit and clock signals CLK. A first signal transmission unit ST(1) starts to be driven according to the start pulse Vst, and the other signal transmission units ( . . . , ST(n−2), ST(n−1), ST(n), ST(n+1), ST(n+2), . . . ) receive the carry signals ( . . . , Cout(n−2), Cout(n−1), Cout(n), Cout(n+1), Cout(n+2), . . . ) from the previous odd-numbered or even-numbered signal transmission units to start to be driven.

Figure 6:
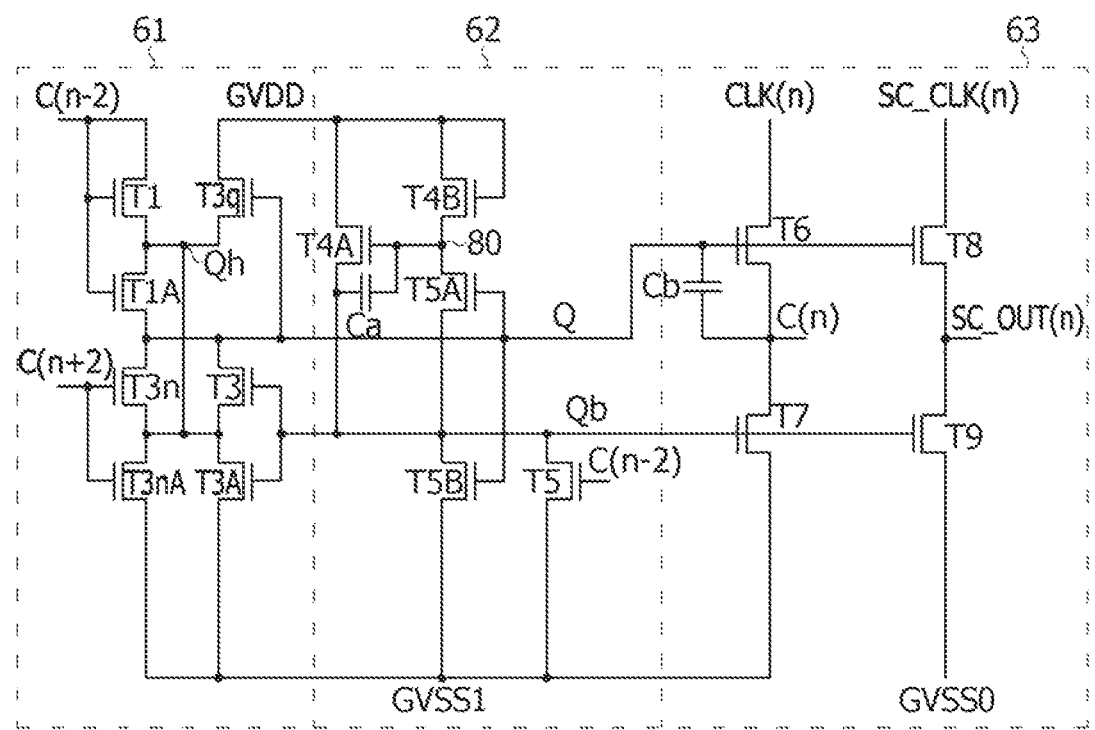
FIG. 6 is a circuit diagram illustrating the scan driver according to the embodiment of the present disclosure in detail.

FIG. 6 is a circuit diagram illustrating the scan driver according to the embodiment of the present disclosure in detail. Transistors T1 to T9 constituting the scan driver 121 can be implemented with n-channel oxide thin film transistors (TFTs). A circuit shown in FIG. 6 is a circuit of an nth (n is a positive integer) signal transmission unit ST(n). Other signal transmission units can be implemented with circuits substantially the same as the nth signal transmission unit ST(n). FIG. 7 is a waveform diagram illustrating input and output signals and voltages of control nodes of the scan driver shown in FIG. 6.

Referring to FIGS. 6 and 7, the scan driver 121 according to the embodiment can include a first control node (hereinafter referred to as a "Q node"), a second control node (hereinafter referred to as a "Qb node"), a first circuit unit 61, a second circuit unit 62, and a third circuit unit 63.

The first circuit unit 61 serves to control charging and discharging of the Q node Q and the Qb node Qb. The first circuit unit 61 includes a first transistor T1, a first-a transistor T1A, a third transistor T3, a third-a transistor T3A, a third-n transistor T3n, a third-nA transistor T3nA, and a third-q transistor T3q.

The first transistor T1 is turned on by an N−2th carry signal applied through an N−2th carry signal line C(n−2), and transmits the N−2th carry signal to a Qh node Qh. In the first transistor T1, a gate electrode and a first electrode are commonly connected to the N−2th carry signal line C(n−2), and a second electrode is connected to the Qh node Qh. Here, "N−2th" means or is equal to "(N−2)th", and similar interpretation can be applied to similar phrases. For example, "N+2th" means "(N+2)th". etc.

The first-a transistor T1A is turned on by the N−2th carry signal applied through the N−2th carry signal line C(n−2), and charges the Q node Q based on the N−2th carry signal. In the first-a transistor T1A, a gate electrode is connected to the N−2th carry signal line C(n−2), a first electrode is connected to the second electrode of the first transistor T1, and a second electrode is connected to the Q node Q.

The third transistor T3 is turned on by the Qb node Qb and discharges the Q node Q to a second low potential voltage of a second low potential voltage line GVSS1 together with the third-a transistor T3A. In the third transistor T3, a gate electrode is connected to the Qb node Qb, a first electrode is connected to the Q node Q, and a second electrode is connected to a first electrode of the third-a transistor T3A.

The third-a transistor T3A is turned on by the Qb node Qb and discharges the Q node Q to the second low potential voltage of the second low potential voltage line GVSS1 together with the third transistor T3. In the third-a transistor T3A, a gate electrode is connected to the Qb node Qb, the first electrode is connected to the second electrode of the third transistor T3, and a second electrode is connected to the second low potential voltage line GVSS1.

The third-n transistor T3n is turned on by an N+2th carry signal applied through an N+2th carry signal line C(n+2), and discharges the Q node Q to the second low potential voltage of the second low potential voltage line GVSS1 together with the third-nA transistor T3nA. In the third-n transistor T3n, a gate electrode is connected to the N+2th carry signal line C(n+2), a first electrode is connected to the Q node Q, and a second electrode is connected to a first electrode of the third-nA transistor T3nA.

The third-nA transistor T3nA is turned on by the N+2th carry signal applied through the N+2th carry signal line C(n+2), and discharges the Q node Q to the second low potential voltage of the second low potential voltage line GVSS1 together with the third-n transistor T3n. In the third-nA transistor T3nA, a gate electrode is connected to the N+2th carry signal line C(n+2), the first electrode is connected to the second electrode of the third-n transistor T3n, and a second electrode is connected to the second low potential voltage line GVSS1.

The third-q transistor T3q is turned on by the Q node Q and transmits a high potential voltage of a high potential voltage line GVDD to the Qh node Qh. In the third-q transistor T3q, a gate electrode is connected to the Q node Q, a first electrode is connected to the high potential voltage line GVDD, and a second electrode is connected to the Qh node Qh.

The second circuit unit 62 includes a fourth-a transistor T4A, a fourth-b transistor T4B, a fifth-a transistor T5A, a fifth-b transistor T5B, and a fifth transistor T5.

The second circuit unit 62 includes an inverter circuit which inverts the voltage of the Q node Q and applies the voltage to the Qb node Qb. The inverter circuit includes a Qb node charging unit and a Qb node discharging unit.

The Qb node charging unit includes a plurality of transistors T4A and T4B. The Qb node discharging unit includes a plurality of transistors T5A and T5B, and the plurality of transistors T5A and T5B are connected in series. The plurality of transistors T5A and T5B are connected in series between a first node 80 and the second low potential voltage line GVSS1.

The fourth-a transistor T4A is turned on by the high potential voltage transmitted through the fourth-b transistor T4B and charges the Qb node Qb to the high potential voltage applied to the high potential voltage line GVDD. A first capacitor Ca serves to form a boot strapping voltage at a gate node of the fourth-a transistor T4A. In the fourth-a transistor T4A, a gate electrode is connected to one end of the first capacitor Ca and a second electrode of the fourth-b transistor T4B, a first electrode is connected to the high potential voltage line GVDD, and a second electrode is connected to the other end of the first capacitor Ca and the Qb node Qb.

The fourth-b transistor T4B is turned on by the high potential voltage and transmits the high potential voltage applied to the high potential voltage line GVDD to the gate node of the fourth-a transistor T4A. In the fourth-b transistor T4B, a gate and a first electrode are connected to the high potential voltage line GVDD, and a second electrode is connected to the gate electrode of the fourth-a transistor T4A and a first electrode of the fifth-a transistor T5A.

The fifth-a transistor T5A is turned on by the Q node Q, and discharges the first node 80 to the second low potential voltage applied to the second low potential voltage line GVSS1 together with the fifth-b transistor T5B. In the fifth-a transistor T5A, a gate electrode is connected to the Q node Q, the first electrode is connected to the gate electrode of the fourth-a transistor T4A and the second electrode of the fourth-b transistor T4B, and a second electrode is connected to the Qb node Qb.

The fifth-b transistor T5B is turned on by the Q node Q, and discharges the first node 80 to the second low potential voltage applied to the second low potential voltage line GVSS1 together with the fifth-a transistor T5A. In the fifth-b transistor T5B, a gate electrode is connected to the Q node Q, a first electrode is connected to the second electrode of the fourth-a transistor T4A, the one end of the first capacitor Ca, and the Qb node Qb, and a second electrode is connected to the second low potential voltage line GVSS1.

The fifth transistor T5 is turned on by an N−2th carry signal of an N−2th carry signal line C(n−2) and discharges the Qb node Qb to the second low potential voltage of the second low potential voltage line GVSS1. In the fifth transistor T5, a gate electrode is connected to the N−2th carry signal line C(n−2), a first electrode is connected to the Qb node Qb, and a second electrode is connected to the second low potential voltage line GVSS1.

The third circuit unit 63 outputs scan signals SC_OUT(n) and carry signals C(n) in response to potentials of the Q node Q and the Qb node Qb. The third circuit unit 63 includes first buffer transistors T6 and T7 which output the carry signals C(n) and second buffer transistors T8 and T9 which output the scan signals SC_OUT(n).

The first buffer transistors T6 and T7 are classified into a first pull-up transistor T6 that is turned on based on the potential of the Q node Q and a first pull-down transistor T7 that is turned on based on the potential of the Qb node Qb. In the first pull-up transistor T6, a gate electrode is connected to the Q node Q and one end of a second capacitor Cb, a first electrode is connected to a first clock signal line CLK(n), and a second electrode is connected to a first output terminal C(n) and the other end of the second capacitor Cb. In the first pull-down transistor T7, a gate electrode is connected to the Qb node Qb, a first electrode is connected to the first output terminal C(n) and the other end of the second capacitor Cb, and a second electrode is connected to the second low potential voltage line GVSS1. The first buffer transistors T6 and T7 output the carry signal C(n) based on a first clock signal applied through the first clock signal line CLK(n) and a second low potential voltage applied through the second low potential voltage line GVSS1.

The second buffer transistors T8 and T9 are classified into a second pull-up transistor T8 that is turned on based on the potential of the Q node Q and a second pull-down transistor T9 that is turned on based on the potential of the Qb node Qb. In the second pull-up transistor T8, a gate electrode is connected to the Q node Q, a first electrode is connected to a second clock signal line SC_CLK(n), and a second electrode is connected to a second output terminal SC_OUT(n). In the second pull-down transistor T9, a gate electrode is connected to the Qb node Qb, a first electrode is connected to the second output terminal SC_OUT(n), and a second electrode is connected to a first low potential voltage line GVSS0. The second buffer transistors T8 and T9 output the second scan signal SC_OUT(n) based on a second clock signal applied through the second clock signal line SC_CLK(n) and a first low potential voltage applied through the first low potential voltage line GVSS0. The first low potential voltage is set to be higher than the second low potential voltage.

A structural advantage of the inverter circuit applied to the scan driver according to the embodiment will be described.

Figure 8A:
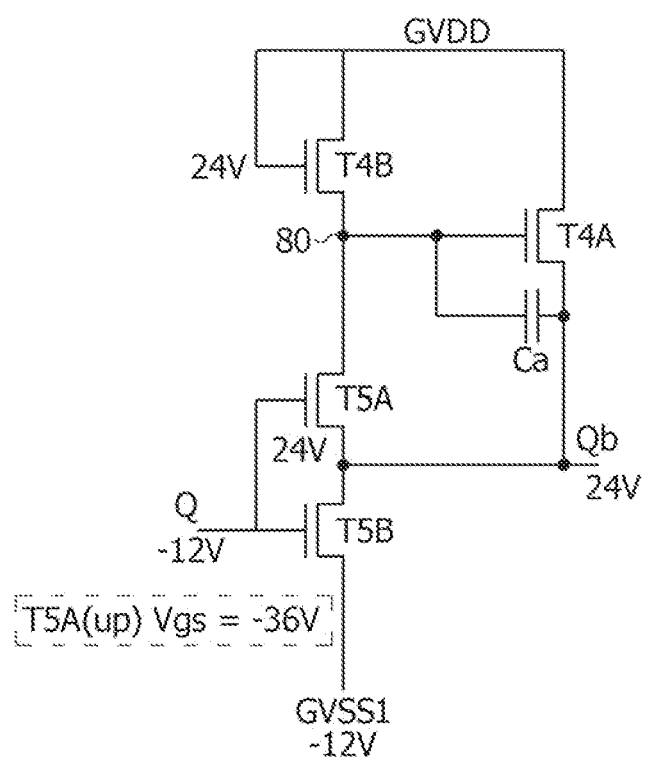
FIGS. 8A and 8B are circuit diagrams for comparatively describing a ripple prevention principle of an inverter.
Figure 8B:
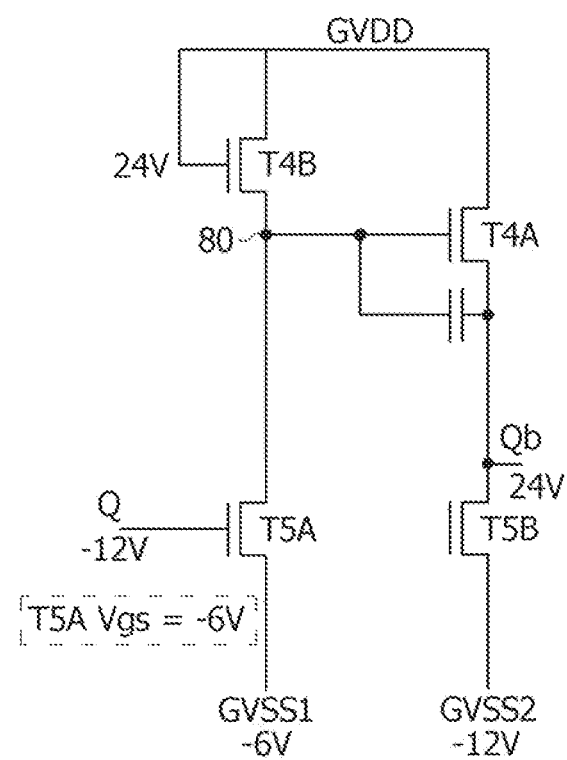
Figure 9A:
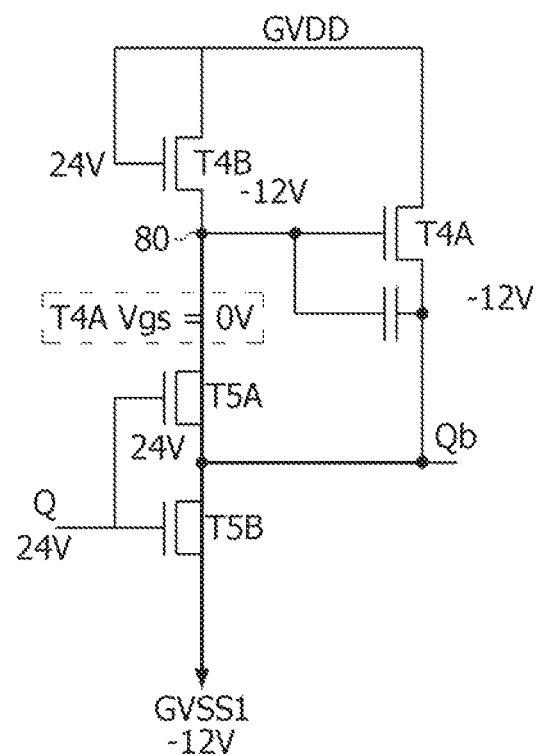
FIGS. 9A and 9B are circuit diagrams for comparatively describing a leakage current prevention principle of the inverter.
Figures 9B, 10:
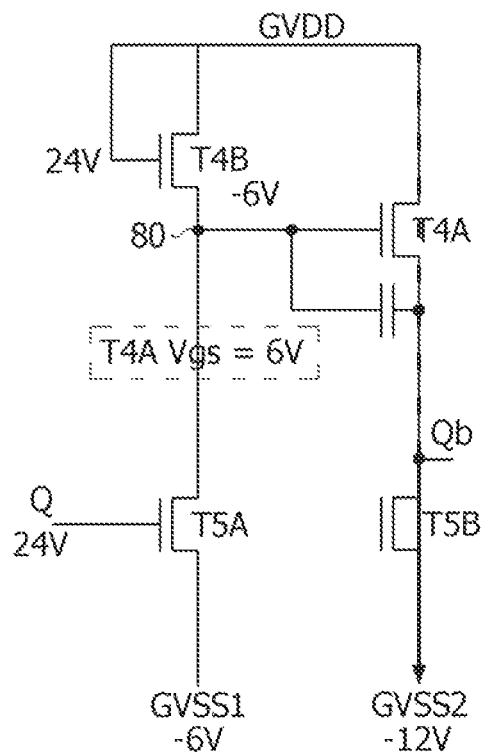
FIG. 10 is a view illustrating a simulation result of the inverter circuit according to the embodiment.

FIGS. 8A and 8B are circuit diagrams for comparatively describing a ripple prevention principle of the inverter, FIGS. 9A and 9B are circuit diagrams for comparatively describing a leakage current prevention principle of the inverter, and FIG. 10 is a view illustrating a simulation result of the inverter circuit according to the embodiment.

Referring to FIG. 8A in relation to ripple prevention of the inverter, in an inverter circuit in which the Qb node discharging unit according to the embodiment is implemented in a structure in which two transistors are connected in series, and one low-voltage power supply is connected, when a voltage of the Q node Q is a low voltage and a voltage of the Qb node Qb is a high voltage, since all of the plurality of series-connected transistors T5A and T5B are turned off in the Qb node discharging unit, a Vgs of the fifth-a transistor T5A becomes −36 V. Accordingly, the inverter circuit according to the embodiment can respond to a ripple by the Qb node Qb(n) within 36 V.

As shown in FIG. 8B, an inverter circuit to be compared to the inverter circuit of the embodiment is an inverter circuit in which two low-voltage power supplies are connected, and when the voltage of the Q node Q is the low voltage and the voltage of the Qb node Qb is the high voltage, since the plurality of transistors T5A and T5B are turned off in the Qb node discharging unit, the Vgs of the fifth-a transistor T5A becomes −6 V. Accordingly, the comparative inverter circuit can also respond to the ripple by the Qb node Qb(n) within 6 V.

Referring to FIG. 9A in relation to leakage current prevention, in an inverter circuit in which the Qb node discharging unit according to the embodiment is implemented in a structure in which two transistors are connected in series, and one low-voltage power supply is connected, when the voltage of the Q node Q is a high voltage (24 V) and the voltage of the Qb node Qb is a low voltage (−12 V), since both the first node and the Qb node are discharged to the first low potential voltage (−12 V) even when the plurality of series-connected transistors T5A and T5B are turned on, a Vgs of the fourth-a transistor T4A is formed to be 0 V, and thus a leakage current in the first low potential voltage line decreases.

As shown in FIG. 9B, an inverter circuit to be compared to the inverter circuit of the embodiment is an inverter circuit in which two low-voltage power supplies are connected, and when the voltage of the Q node Q is the high voltage (24 V) and the voltage of the Qb node Qb is the low voltage (−12 V), since the plurality of parallel-connected transistors T5A and T5B are turned on, the first node is discharged to the first low potential voltage (−6 V) and the Qb node is discharged to the second low potential voltage (−12 V) so that the Vgs of the fourth-a transistor T4A is formed to be 6 V (=−6 V−(−12 V)), and thus a leakage current is generated in the second low potential voltage line.

Accordingly, as shown in FIG. 10, the leakage current was measured as 19.626 mA only in the first low potential voltage line in the scan driver to which the inverter circuit according to the embodiment was applied, but in the scan driver to which the inverter circuit for comparison was applied, since the leakage current in the first low potential voltage line was measured as 1.186 mA and the leakage current in the second low-potential voltage line was measured as 18.241 mA, the sum of the leakage currents was 19.427 mA.

According to this simulation result, it can be seen that the scan driver to which the inverter circuit according to the embodiment is applied exhibits comparable performance to reduce the leakage current while minimizing influence by the ripple of the Q node even when the one low potential voltage is used.

Figure 11:
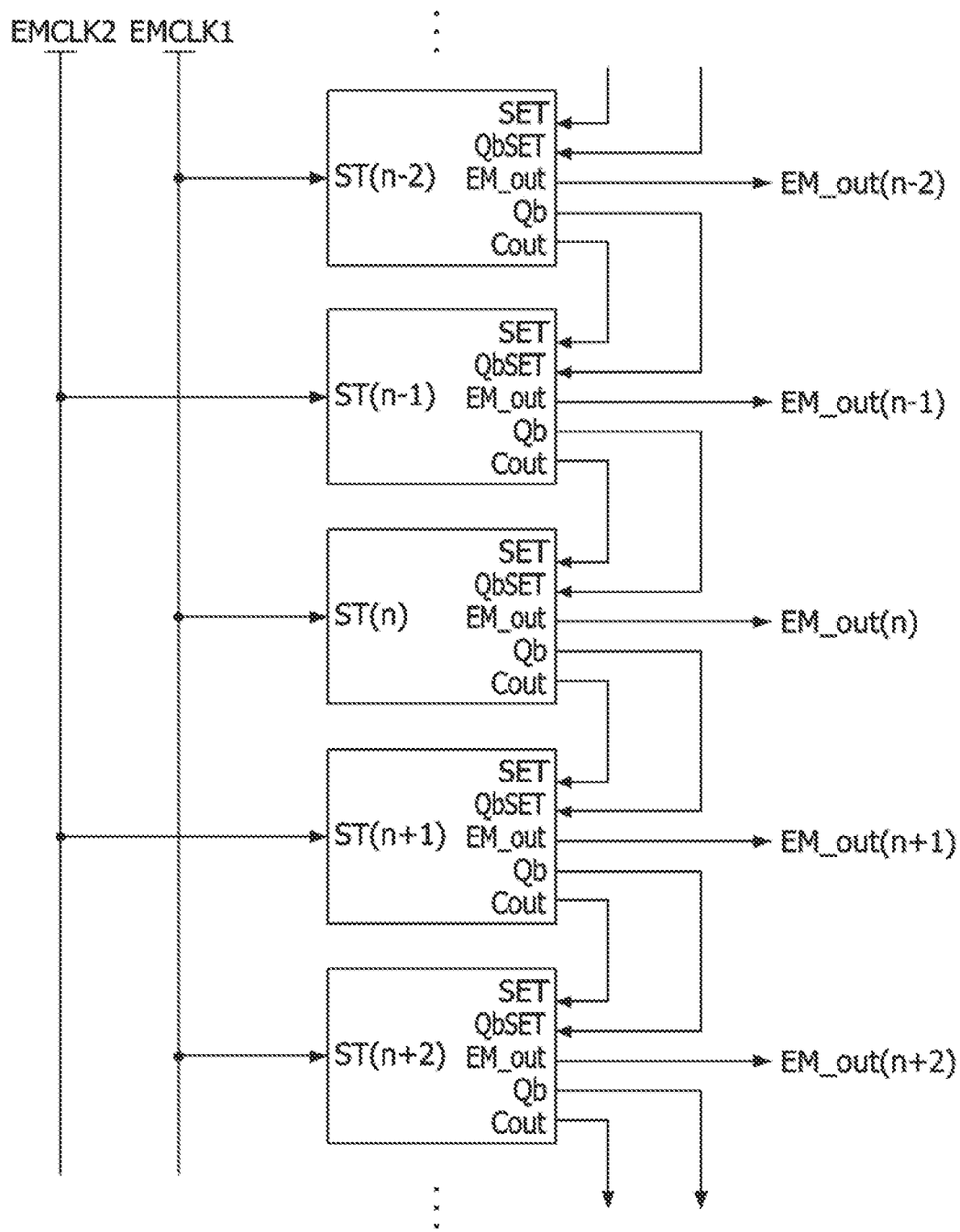
FIG. 11 is a view schematically illustrating an EM driver according to the embodiment of the present disclosure.

FIG. 11 is a view schematically illustrating the EM driver according to the embodiment of the present disclosure.

Referring to FIG. 11, the EM driver 122 according to the embodiment includes a plurality of signal processing units ( . . . , ST(n−2), ST(n−1), ST(n), ST(n+1), ST(n+2), . . . ) cascade-connected via a carry line through which a carry signal is transmitted.

The timing controller 130 can adjust a width and multi-output of an output signal EM_OUT of the EM driver using a start pulse Vst input to the EM driver 122.

Each of the signal processing units ( . . . , ST(n−2), ST(n−1), ST(n), ST(n+1), ST(n+2), . . . ) receives a start pulse or a carry signal ( . . . , C(n−2), C(n−1), C(n), C(n+1), C(n+2), . . . ) output from a previous signal processing units and receives a shift clock EMCLK. A first signal processing unit ST(1) starts to be driven according to the start pulse Vst, and the other signal processing units ( . . . , ST(n−2), ST(n−1), ST(n), ST(n+1), ST(n+2), . . . ) receive the carry signals ( . . . , C(n−2), C(n−1), C(n), C(n+1), C(n+2), . . . ) from the previous signal processing units to start to be driven. The shift clock EMCLK can be an N (N is a positive integer greater than or equal to 2) phase clock. For example, the shift clock EMCLK can be two-phase clocks EMCLK1 and EMCLK2 as shown in FIG. 7. The phases of the two-phase clocks EMCLK1 and EMCLK2 are opposite to each other. The signal processing units ( . . . , ST(n-2), ST(n-1), ST(n), ST(n+1), ST(n+2), . . . ) shift the start pulses or the carry signals ( . . . , C(n-2), C(n-1), C(n), C(n+1), C(n+2), . . . ) from the previous signal processing units according to a timing of the shift clock to sequentially output EM signals ( . . . , EM_out(n-2), EM_out(n-1), EM_out(n), EM_out(n+1), EM_out(n+2), . . . ).

Figure 12:
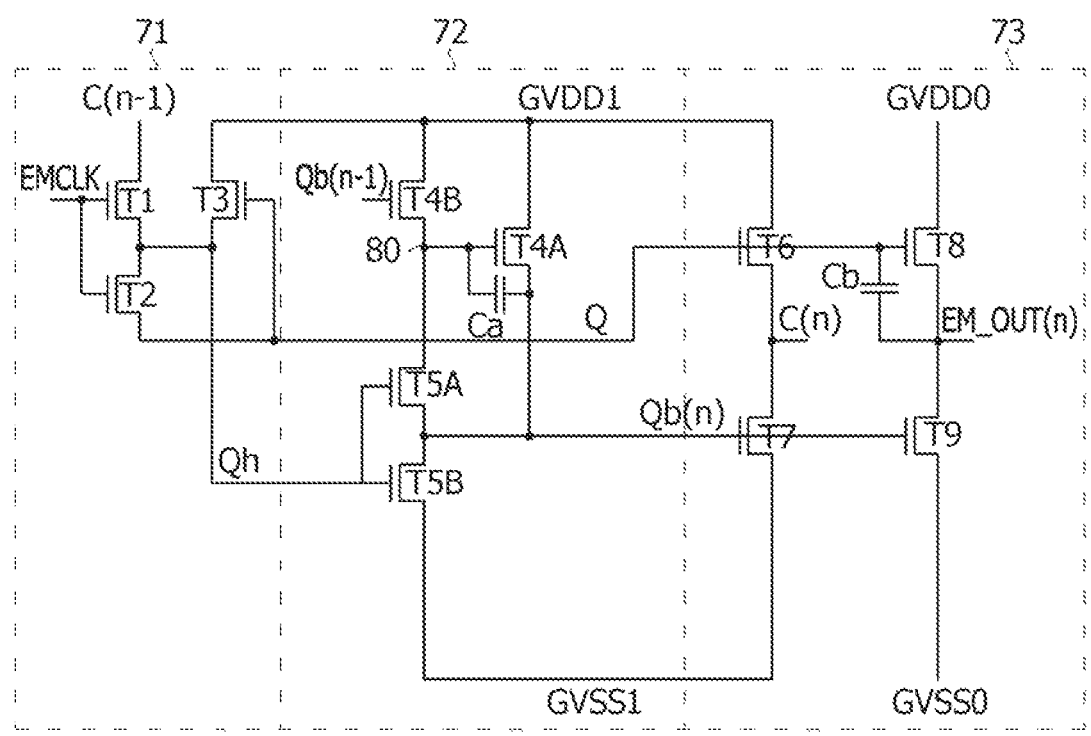
FIG. 12 is a circuit diagram illustrating the EM driver according to the embodiment of the present disclosure in detail.
Figure 13:
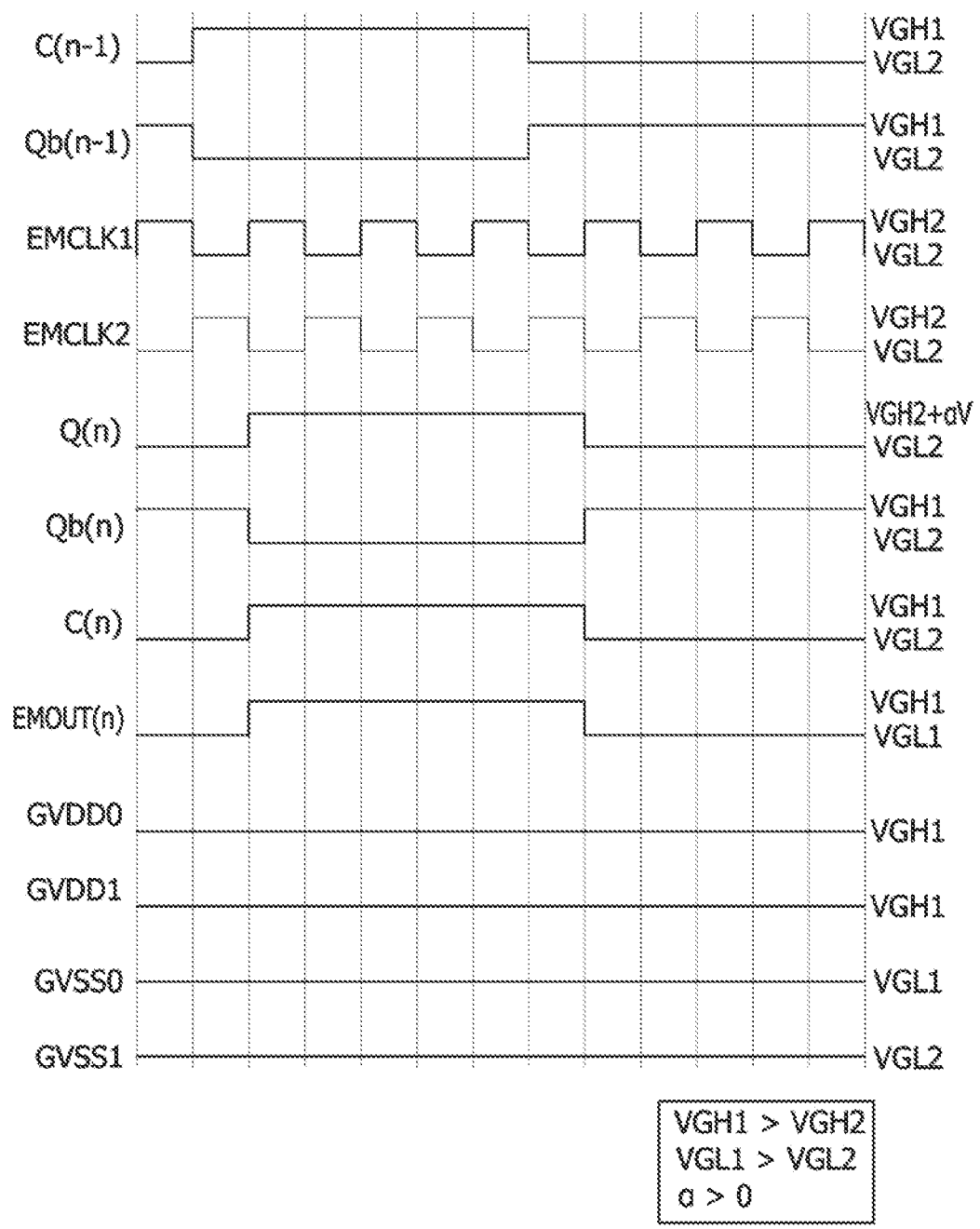
FIG. 13 is a waveform diagram illustrating input and output signals and voltages of control nodes of the EM driver shown in FIG. 12.

FIG. 12 is a circuit diagram illustrating the EM driver according to the embodiment of the present disclosure in detail. Transistors T1 to T9 constituting the EM driver 122 can be implemented with n-channel oxide TFTs. But the present disclosure is not limited thereto. Transistors T1 to T9 can also be implemented with p-channel oxide TFTs or n-channel amorphous silicon TFTs. A circuit shown in FIG. 12 is a circuit of an nth (n is a positive integer) signal transmission unit ST(n). Other signal transmission units can be implemented with circuits substantially the same as the nth signal transmission unit ST(n). FIG. 13 is a waveform diagram illustrating input and output signals and voltages of control nodes of the EM driver shown in FIG. 12.

Referring to FIGS. 12 and 13, the EM driver 122 according to the embodiment can include a first control node (hereinafter referred to as a "Q node"), a second control node (hereinafter referred to as a "Qb node"), a first circuit unit 71, a second circuit unit 72, and a third circuit unit 73.

The first circuit unit 71 serves to control charging and discharging of the Q node Q and the Qb node Qb(n). When a shift clock EMCLK1 has a voltage greater than or equal to a gate-on voltage VEH, the first circuit unit 71 supplies a voltage of an n-1th carry signal C(n-1) from an n-1th signal processing unit ST(n-1), which is a previous signal processing unit, to the Q node Q(n) to charge the Q node Q(n). This first circuit unit 71 includes first to third transistors T1, T2, and T3. Here, the phrase "n-1th" means or is equal to "(n-1)th".

The first transistor T1 is turned on to supply a voltage (24 V) of the carry signal C(n-1) to the Qh node Qh when the shift clock EMCLK1 is a high voltage VGH2 greater than or equal to the gate-on voltage VEH. The first transistor T1 includes a gate to which the shift clock EMCLK1 is applied, a first electrode connected to an N-1th carry signal line C(n-1), and a second electrode connected to the Qh node Qh. Here, "N-1th" means or is equal to "(N-1)th".

The high voltage VGH2 of the shift clock EMCLK1 can be set to a voltage lower than a second high potential voltage VGH1. High voltages VGH1 of the carry signal C(n-1) and an EM signal EM_OUT(n) are the same voltages as the second high potential voltage VGH1. When the high voltage VGH2 of the shift clock EMCLK1 is set to be lower than the second high potential voltage VGH1, a Vgs of the first transistor T1 changes to a negative voltage when the voltage of the Q node Q(n) is boosted, and the Q node Q(n) floats, and thus voltage boosting of the Q node Q(n) can be performed better.

The second transistor T2 is turned on to supply the voltage of the Qh node Qh to the Q node Q(n) to charge the Q node when the shift clock EMCLK1 is the voltage VGH2 greater than or equal to the gate-on voltage VEH. The second transistor T2 includes a gate to which the shift clock EMCLK1 is applied, a first electrode connected to the Qh node Qh, and a second electrode connected to the Q node Q(n).

The first and second transistors T1 and T2 are connected in series. The first and second transistors T1 and T2 are connected in series between the N-1th carry signal line C(n-1) and the Qnode Q(n).

The third transistor T3 is turned on to supply the second high potential voltage to the Qh node Qh through a second high potential voltage line GVDD1 when the Q node Q(n) is charged. The second high potential voltage is supplied to the Qh node Qh through the second high potential voltage line GVDD1. The third transistor T3 includes a gate connected to the Q node Q(n), a first electrode connected to the second high potential voltage line GVDD1, and a second electrode connected to the Qh node Qh.

The second circuit unit 72 includes an inverter circuit which inverts a voltage of the Q node Q(n) and applies the voltage to the Qb node Qb(n). The inverter circuit of the second circuit unit 72 includes a Qb node charging unit and a Qb node discharging unit.

The Qb node charging unit includes a plurality of transistors T4A and T4B. The Qb node discharging unit includes a plurality of transistors T5A and T5B, and the plurality of transistors T5A and T5B are connected in series.

The Qb node charging unit switches a current path between the second high potential voltage line GVDD1 and the Qb node Qb(n) according to a voltage of an n-1th Qb node Qb(n-1) from an n-1th signal transmission unit ST(n-1).

The fourth-a transistor T4A is turned on to charge the Qb node Qb(n) to a high voltage greater than or equal to the gate-on voltage VEH by connecting the second high potential voltage line GVDD1 to the Qb node Qb(n) when a voltage of a first node 80 is a high voltage greater than or equal to the gate-on voltage VEH. The fourth-a transistor T4A includes a gate connected to the first node 80, a first electrode connected to the second high potential voltage line GVDD1, and a second electrode connected to the Qb node Qb(n). A first capacitor Ca is connected between the gate and the second electrode of the fourth-a transistor T4A. When the fourth-a transistor T4A is turned on by the first capacitor Ca, the voltage of the first node 80 can be boosted.

The fourth-b transistor T4B is turned on when the voltage of the n-1th Qb node Qb(n-1) of the n-1th signal transmission unit ST(n-1) is a high voltage greater than or equal to the gate-on voltage VEH to charge the first node 80 to a voltage greater than or equal to the gate-on voltage VEH by supplying the second high potential voltage to the first node 80. The fourth-b transistor T4B includes a gate connected to the n-1th Qb node Qb(n-1) of the n-1th signal transmission unit ST(n-1), a first electrode connected to the second high potential voltage line GVDD1, and a second electrode connected to the first node 80

The Qb node discharging unit is turned on to discharge the Qb node Qb(n) when the voltage of the Q node Q(n) and the voltage of the previous carry signal C(n-1) input from the n-1th signal transmission unit ST(n-1) are high voltages greater than or equal to the gate-on voltage VEH.

The fifth-a transistor T5A is turned on to connect the first node 80 to the Qb node Qb(n) when the voltage of the Qh node Qh is a high voltage greater than or equal to the gate-on voltage VEH. The fifth-a transistor T5A includes a gate connected to the Qh node Qh, a first electrode connected to the first node 80, and a second electrode connected to the Qb node Qb(n).

The fifth-b transistor T5B is turned on to discharge the voltage of the Qb node Qb(n) to a second low potential voltage by connecting the Qb node Qb(n) to a second low potential voltage line GVSS1 when the voltage of the Qh node Qh is a high voltage greater than or equal to the gate-on voltage VEH. The fifth-b transistor T5B includes a gate connected to the Qh node Qh, a first electrode connected to the Qb node Qb(n), and a second electrode connected to the second low potential voltage line GVSS1.

The third circuit unit 73 outputs the EM signals EM_OUT(n) and the carry signal C(n) in response to the potentials of the Q node Q and the Qb node Qb. The third circuit unit 73 includes first buffer transistors T6 and T7 which output the carry signal C(n) and second buffer transistors T8 and T9 which output the EM signals EM_OUT(n).

The first buffer transistors T6 and T7 are classified into a first pull-up transistor T6 that is turned on based on the potential of the Q node Q and a first pull-down transistor T7 that is turned on based on the potential of the Qb node Qb. In the first pull-up transistor T6, a gate is connected to the Q node Q, a first electrode is connected to the second high potential voltage line GVDD1, and a second electrode is connected to a first output terminal C(n). In the first pull-down transistor T7, a gate is connected to the Qb node Qb, a first electrode is connected to the first output terminal C(n), and a second electrode is connected to the second low potential voltage line GVSS1. The first buffer transistors T6 and T7 output the carry signal C(n) based on the second high potential voltage applied through the second high potential voltage line GVDD1 and the second low potential voltage applied through the second low potential voltage line GVSS1.

The second buffer transistors T8 and T9 are classified into a second pull-up transistor T8 that is turned on based on the potential of the Q node Q and a second pull-down transistor T9 that is turned on based on the potential of the Qb node Qb. In the second pull-up transistor T8, a gate is connected to the Q node Q and one end of a second capacitor Cb, a first electrode is connected to a first high potential voltage line GVDD0, and a second electrode is connected to a second output terminal EM_OUT(n). In the second pull-down transistor T9, a gate is connected to the Qb node Qb, a first electrode is connected to the second output terminal EM_OUT(n) and the other end of the second capacitor Cb, and a second electrode is connected to a first low potential voltage line GVSS0. The second buffer transistors T8 and T9 output the second EM signal EM_OUT(n) based on a first high potential voltage applied through the first high potential voltage line GVDD0 and a first low potential voltage applied through the first low potential voltage line GVSS0. The first low potential voltage is set to be higher than the second low potential voltage.

A structural advantage of the inverter circuit applied to the EM driver according to the embodiment will be described.

Figure 14A:
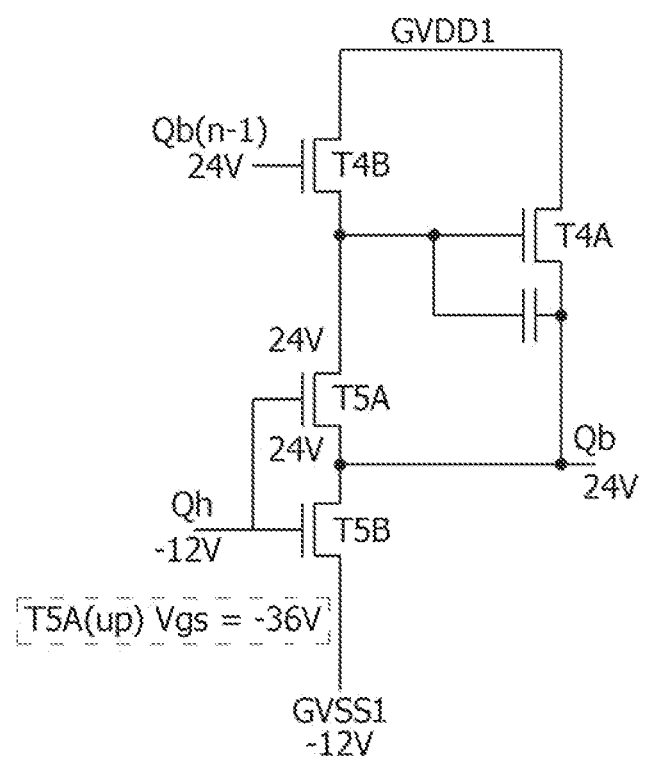
FIGS. 14A and 14B are circuit diagrams for comparatively describing the ripple prevention principle of the inverter.
Figure 14B:
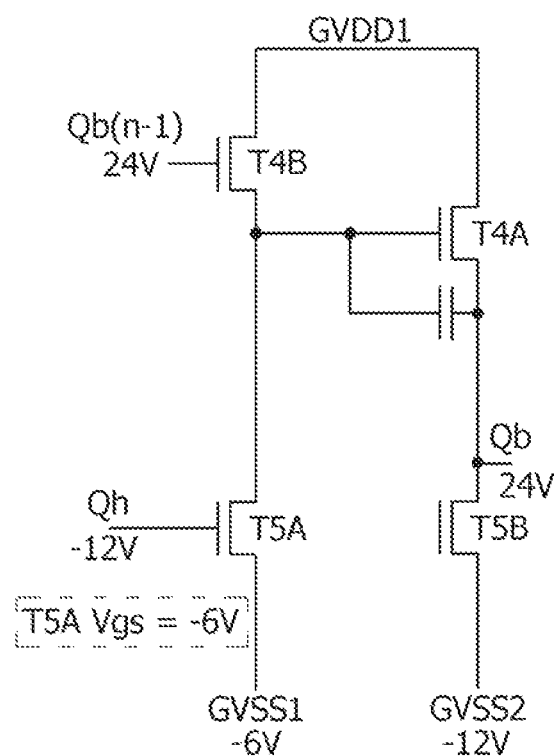
Figure 15A:
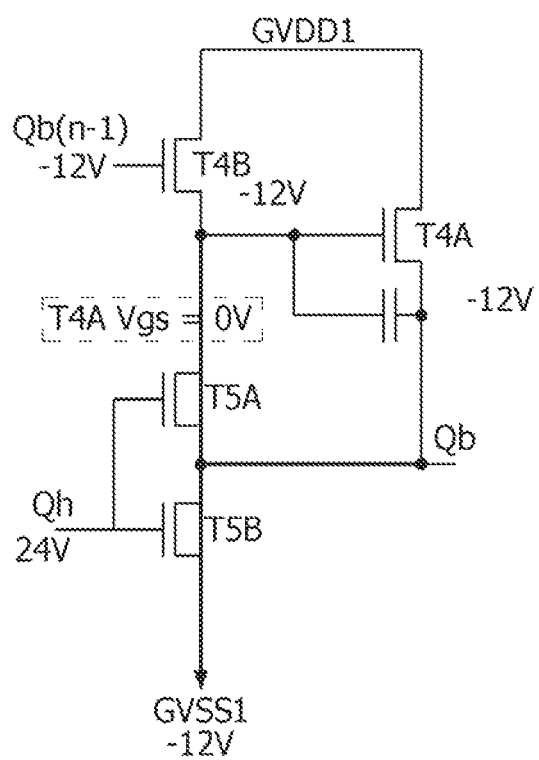
FIGS. 15A and 15B are circuit diagrams for comparatively describing the leakage current prevention principle of the inverter.
Figures 15B, 16:
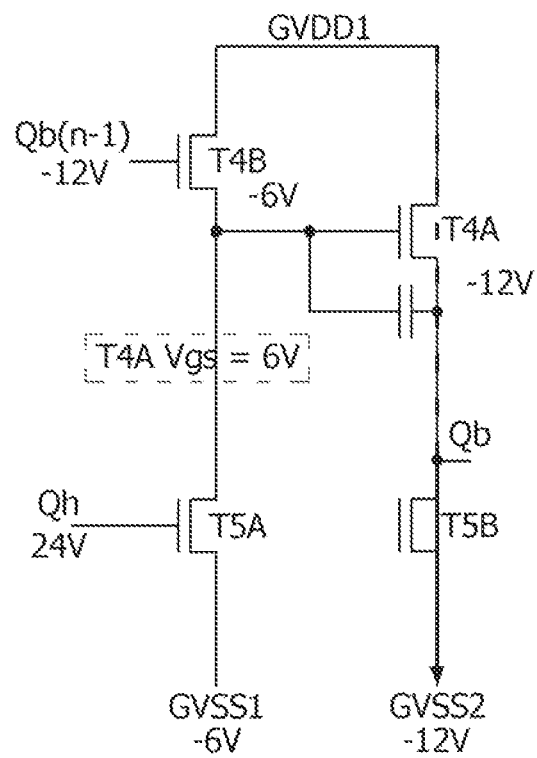
FIG. 16 is a view illustrating a simulation result of the inverter circuit according to the embodiment.

FIGS. 14A and 14B are circuit diagrams for comparatively describing a ripple prevention principle of an inverter, FIGS. 15A and 15B are circuit diagrams for comparatively describing a leakage current prevention principle of the inverter, and FIG. 16 is a view illustrating a simulation result of the inverter circuit according to the embodiment.

Referring to FIG. 14A in relation to ripple prevention of the inverter, in an inverter circuit in which the Qb node discharging unit according to the embodiment is implemented in a structure in which two transistors are connected in series, and one low-voltage power supply is connected, when a voltage of the Qh node Qh is a low voltage and a voltage of the Qb node Qb(n) is a high voltage, since the plurality of series-connected transistors T5A and T5B are turned off in the Qb node discharging unit, a Vgs of the fifth-a transistor T5A becomes−36 V. Accordingly, the inverter circuit according to the embodiment can respond to a ripple by the Qb node Qb(n) within 36 V.

As shown in FIG. 14B, an inverter circuit to be compared to the inverter circuit of the embodiment is an inverter circuit in which two low-voltage power supplies are connected, and when the voltage of the Qh node Qh is the low voltage and the voltage of the Qb node Qb(n) is the high voltage, since the plurality of series-connected transistors T5A and T5B are turned off in the Qb node discharging unit, the Vgs of the fifth-a transistor T5A becomes −6 V. Accordingly, the inverter circuit according to a first embodiment can also respond to the ripple by the Qb node Qb(n) within 6 V.

Referring to FIG. 15A in relation to leakage current prevention, in an inverter circuit in which the Qb node discharging unit according to the embodiment is implemented in a structure in which two transistors are connected in series, and one low-voltage power supply is connected, when the voltage of the Qh node Qh is the high voltage and the voltage of the Qb node Qb(n) is the low voltage, since both the first node and the Qb node are discharged to the first low potential voltage even when the plurality of series-connected transistors T5A and T5B are turned on, a Vgs of the fourth-a transistor T4A is formed to be 0 V, and thus a leakage current toward the first low potential voltage line decreases.

As shown in FIG. 15B, an inverter circuit to be compared to the inverter circuit of the embodiment is an inverter circuit in which two low-voltage power supplies are connected, and when the voltage of the Qh node Qh is the high voltage and the voltage of the Qb node Qb(n) is the low voltage, since the plurality of transistors T5A and T5B are turned on, the first node 80 is discharged to the first low potential voltage and the Qb node is discharged to the second low potential voltage so that the Vgs of the fourth-a transistor T4A is formed to be 6 V, and thus a leakage current toward the second low potential voltage line is generated.

Accordingly, as shown in FIG. 16, the leakage current was measured as 10.509 mA only in the first low potential voltage line in the EM driver to which the inverter circuit according to the embodiment was applied, but in the EM driver to which the inverter circuit for comparison was applied, since the leakage current in the first low potential voltage line was measured as 0.054 mA and the leakage current in the second low-potential voltage line was measured as 19.407 mA, the sum of the leakage currents was 19.461 mA.

According to this simulation result, it can be seen that the EM driver to which the inverter circuit according to the embodiment is applied exhibits improved performance to reduce the leakage current while minimizing influence by the ripple of the Q node even when one low potential power supply is used.

In the present disclosure, since a Qb node charging unit and a Qb node discharging unit of an inverter circuit are composed of a plurality of transistors, and the Qb node discharging unit is implemented in a structure in which the plurality of transistors are connected in series, one low voltage power supply can be applied to prevent a malfunction due to a ripple of a Q node without the need to separately apply a plurality of low voltage power supplies.

In the present disclosure, influence of the ripple when the Q node is at a low voltage can be minimized.

In the present disclosure, a leakage current when the Q node is at a high voltage can be minimized.

In the present disclosure, since one low voltage power supply is applied, manufacturing costs can be reduced.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An inverter circuit comprising:
a first transistor connected between a high potential voltage line and a first node;
a second transistor having a gate connected to the first node and turned on according to a voltage of the first node to charge a second control node to a high potential voltage applied to the high potential voltage line;
a third transistor having a gate connected to a first control node, a first electrode connected to the first node, and a second electrode directly connected to the second control node; and
a fourth transistor having a gate connected to the first control node, a first electrode directly connected to the second control node, and a second electrode connected to a low potential voltage line,
wherein the third transistor and the fourth transistor are turned on according to a voltage of the first control node to discharge the second control node to a low potential voltage applied to the low potential voltage line,
wherein the third transistor and the fourth transistor are connected in series between the first node and the low potential voltage line, and
wherein the first control node is an output node of the inverter circuit.

2. The inverter circuit of claim 1, further comprising a capacitor having one end connected to the first node and the other end connected to the second control node.

3. The inverter circuit of claim 1, wherein, when a high voltage is applied to the first control node, the third transistor and the fourth transistor are turned on to discharge the first node and the second control node to the low potential voltage of the low potential voltage line, and a gate-source voltage of the second transistor stays at 0 V.

4. The inverter circuit of claim 1, wherein, when a low voltage is applied to the second control node,
the third transistor and the fourth transistor are turned on and thus a gate-source voltage of the second transistor is 0 V.

5. The inverter circuit of claim 1, wherein the first transistor has a gate and a first electrode connected to the high potential voltage line, and a second electrode connected to the first node, and
the third transistor and the fourth transistor have gates directly connected to the first control node.

6. The inverter circuit of claim 1, wherein the first transistor has a gate connected to a second control node of an (n−1)th signal transmission unit preceding an nth signal transmission unit which the inverter circuit belongs to, a first electrode connected to the high potential voltage line, and a second electrode connected to the first node, n being a positive integer greater than 1, and
the third transistor and the fourth transistor have gates connected to another control node configured to be connected to the first control node.

7. The inverter circuit of claim 1, wherein the first transistor to the fourth transistor are implemented with n-channel thin film transistors.

8. A gate driver comprising a plurality of signal transmission units cascade-connected via a carry line of an nth signal transmission unit to which a carry signal from other signal transmission units is applied,
wherein n is a positive integer and the nth signal transmission unit includes:
a first circuit unit configured to receive the carry signal from the other signal transmission units to charge a first control node;
a second circuit unit including an inverter circuit configured to discharge a second control node according to a voltage of the first control node; and
a third circuit unit configured to output a gate signal based on a first high potential voltage and a first low potential voltage based on potentials of the first control node and the second control node,
wherein the inverter circuit includes:
a first transistor connected between a second high potential voltage line and a first node;
a second transistor having a gate connected to the first node and turned on according to a voltage of the first node to charge the second control node to a second high potential voltage applied to the second high potential voltage line;
a third transistor having a gate connected to the first control node, a first electrode connected to the first node, and a second electrode directly connected to the second control node; and
a fourth transistor having a gate connected to the first control node, a first electrode directly connected to the second control node, and a second electrode connected to a second low potential voltage line,
the third transistor and the fourth transistor are turned on according to the voltage of the first control node to discharge the second control node to a second low potential voltage applied to the second low potential voltage line, and
the third transistor and the fourth transistor are connected in series between the first node and the second low potential voltage line.

9. The gate driver of claim 8, wherein, when a high voltage is applied to the first control node, the third transistor and the fourth transistor are turned on to discharge the first node and the second control node to the second low potential voltage of the second low potential voltage line, and a gate-source voltage of the second transistor stays at 0 V.

10. The gate driver of claim 8, wherein, when a low voltage is applied to the second control node, the third transistor and the fourth transistor are turned on and thus a gate-source voltage of the second transistor becomes 0 V.

11. The gate driver of claim 8, wherein the first transistor has a gate and a first electrode connected to the second high potential voltage line, and a second electrode connected to the first node, and
the third transistor and the fourth transistor have gates directly connected to the first control node.

12. The gate driver of claim 11, wherein the third circuit unit outputs a scan signal for selecting pixels of a line and a carry signal in response to potentials of the first control node and the second control node.

13. The gate driver of claim 8, wherein the first transistor has a gate connected to a second control node of an (n−1)th signal transmission unit, a first electrode connected to the second high potential voltage line, and a second electrode connected to the first node, and
the third transistor and the fourth transistor have gates connected to another control node configured to be connected to the first control node.

14. The gate driver of claim 13, wherein the third circuit unit outputs an EM signal defining an emission time of pixels and a carry signal in response to potentials of the first control node and the second control node.

15. The gate driver of claim 8, wherein the first circuit unit receives an (n−2)th carry signal and an (n+2)th carry signal from the other signal transmission unit to charge the first control node.

16. The gate driver of claim 8, wherein the first circuit unit receives a clock signal and an (n−1)th carry signal from the other signal transmission unit to charge the first control node.

17. The gate driver of claim 8, wherein the inverter circuit further includes a capacitor having one end connected to the first node and the other end connected to the second control node.

18. A display device comprising:
a data driver configured to output a data voltage;
a gate driver including a signal transmission unit including a first circuit unit configured to receive a carry signal from other signal transmission unit of the gate driver to charge a first control node, a second circuit unit including an inverter circuit configured to discharge a second control node according to a voltage of the first control node, and a third circuit unit configured to output a gate signal based on a first high potential voltage and a first low potential voltage based on potentials of the first control node and the second control node; and
a plurality of pixel circuits configured to receive the data voltage and the gate signal to reproduce an input image,
wherein the inverter circuit includes:
a first transistor connected between a second high potential voltage line and a first node;
a second transistor having a gate connected to the first node and turned on according to a voltage of the first node to charge the second control node to a second high potential voltage applied to the second high potential voltage line;
a third transistor having a gate connected to the first control node, a first electrode connected to the first node, and a second electrode directly connected to the second control node; and
a fourth transistor having a gate connected to the first control node, a first electrode directly connected to the second control node, and a second electrode connected to a second low potential voltage line,
the third transistor and the fourth transistor are turned on according to the voltage of the first control node to discharge the second control node to a second low potential voltage applied to the second low potential voltage line, and
the third transistor and the fourth transistor are connected in series between the first node and the second low potential voltage line.

19. The display device of claim 18, wherein, when a high voltage is applied to the first control node, the third transistor and the fourth transistor are turned on and thus the first node and the second control node are discharged to the second low potential voltage of the second low potential voltage line, and a gate-source voltage of the second transistor stays at 0 V.

20. The display device of claim 18, wherein, when a low voltage is applied to the second control node, the third transistor and the fourth transistor are turned on and thus a gate-source voltage of the second transistor becomes 0 V.

21. The display device of claim 18, wherein the first transistor has a gate and a first electrode connected to the second high potential voltage line, and a second electrode connected to the first node, and
the third transistor and the fourth transistor have gates directly connected to the first control node.

22. The display device of claim 18, wherein the first transistor has a gate connected to a second control node of an (n−1)th signal transmission unit, a first electrode connected to the second high potential voltage line, and a second electrode connected to the first node, and
the third transistor and the fourth transistor have gates connected to another control node configured to be connected to the first control node.

23. The display device of claim 18, wherein all transistors in a panel including the data driver, the gate driver, and the pixel circuits are implemented with oxide thin film transistors (TFTs) including an n-channel type oxide semiconductor.

* * * * *